United States Patent
Knowles et al.

(10) Patent No.: US 6,701,785 B2
(45) Date of Patent: Mar. 9, 2004

(54) TUNING FORK WITH SYMMETRICAL MASS BALANCING AND REDUCED QUADRATURE ERROR

(75) Inventors: Stuart J. Knowles, Walnut Creek, CA (US); Robert H. Moore, Antioch, CA (US)

(73) Assignee: BEI Technologies, Inc., San Francisco, CA (US)

(*) Notice: Subject to any disclaimer, the term of this patent is extended or adjusted under 35 U.S.C. 154(b) by 28 days.

(21) Appl. No.: 09/893,145

(22) Filed: Jun. 26, 2001

(65) Prior Publication Data

US 2002/0021059 A1 Feb. 21, 2002

Related U.S. Application Data

(62) Division of application No. 09/615,294, filed on Jul. 13, 2000.

(51) Int. Cl.[7] .............................................. G01P 9/04
(52) U.S. Cl. ..................................... 73/504.16; 310/370
(58) Field of Search ........................ 73/504.16, 504.12; 310/367, 370, 329

(56) References Cited

U.S. PATENT DOCUMENTS

| | | | | |
|---|---|---|---|---|
| 3,683,213 A | * | 8/1972 | Staudte | 310/9.6 |
| 3,697,766 A | * | 10/1972 | Ganter et al. | 310/8.2 |
| 3,766,616 A | * | 10/1973 | Staudte | 310/8.2 |
| 4,379,244 A | | 4/1983 | Dinger | |
| 4,415,827 A | * | 11/1983 | Chuang | 310/370 |
| 4,468,582 A | * | 8/1984 | Fujiwara et al. | 310/312 |
| 4,930,351 A | * | 6/1990 | Macy et al. | 73/504.16 |
| 5,104,481 A | | 4/1992 | Dooley et al. | |
| 5,296,674 A | * | 3/1994 | Praschek et al. | 219/121.69 |
| 5,396,144 A | | 3/1995 | Gupta et al. | |
| 5,522,249 A | * | 6/1996 | Macy | 73/514.16 |
| 5,585,562 A | * | 12/1996 | Kurata et al. | 73/504.16 |
| 5,708,320 A | * | 1/1998 | Ohnishi et al. | 310/370 |
| 5,763,781 A | * | 6/1998 | Netzer | 73/504.16 |

FOREIGN PATENT DOCUMENTS

| | | | |
|---|---|---|---|
| JP | 53-68191 | * | 9/1978 |
| JP | 53-131789 | | 11/1978 |

OTHER PUBLICATIONS

Wakatsuki et al, Suppression of Null Signals in LiTaO3 Crystal Fork Vibratory Gyroscope, Ultrasonics Symposium, vol. 1, Proceedings, pp. 423–427, Nov. 1995.

* cited by examiner

*Primary Examiner*—Helen Kwok
(74) *Attorney, Agent, or Firm*—Edward S. Wright

(57) ABSTRACT

Tuning fork and method in which a pair of elongated tines having front and rear surfaces are disposed symmetrically about an axis, and balancing masses on the front surface of one tine and on the rear surface of the other tine are trimmed to reduce quadrature error and also to maintain mass balance between the tines.

3 Claims, 2 Drawing Sheets

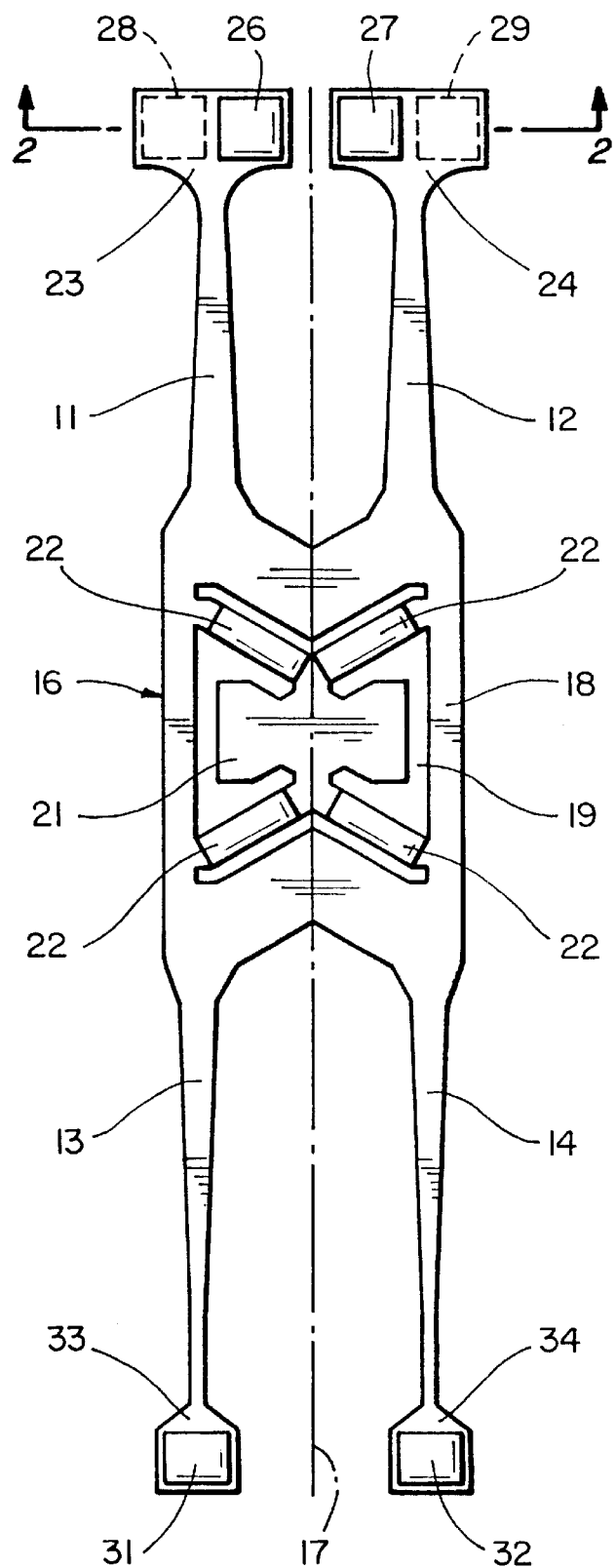
FIG_1

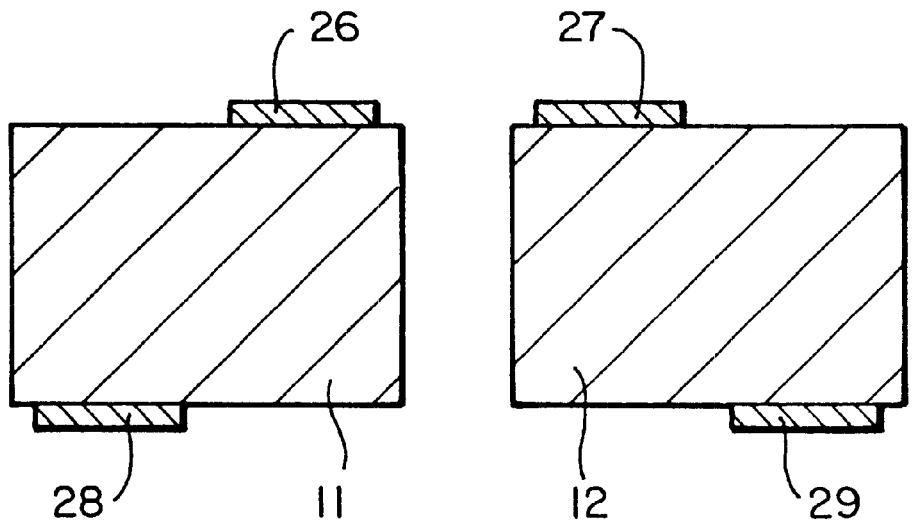
FIG_2
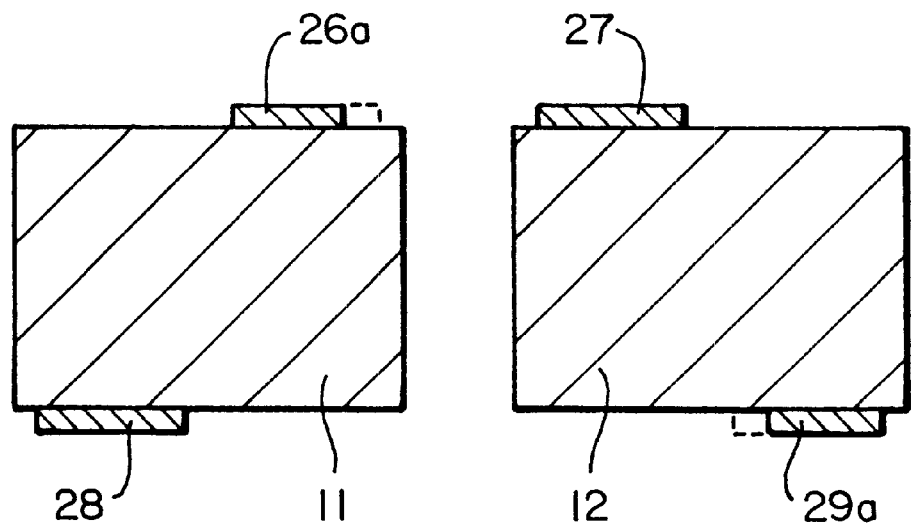
FIG_3

TUNING FORK WITH SYMMETRICAL MASS BALANCING AND REDUCED QUADRATURE ERROR

This is a division of Ser. No. 09/615,294, filed Jul. 13, 2000.

BACKGROUND OF THE INVENTION

1. Field of Invention

This invention pertains generally to tuning forks for use in rate sensors and, more particularly, to a tuning fork and method in which mass balance is maintained when quadrature error is reduced.

2. Related Art

Tuning fork rate sensors make use of the Coriolis effect to sense rotation. The tuning fork is driven to oscillate in a drive move in which the tines oscillate in a plane with roughly equal and opposite amplitudes. Under rotation, the tines experience a Coriolis acceleration proportional to the velocity of the tines and in a direction orthogonal to the drive motion. In a double-ended tuning fork, the orthogonal acceleration excites a pickup mode of vibration which causes both the driven set of tines and the other (pickup) set to vibrate out of the plane of the device. In quartz rate sensors, this out-of-plane vibration is detected piezoelectrically in a manner well known in the art.

A common problem in such devices is that minute variations in fabrication of the tuning fork can cause relatively large errors in the output. These fabrication errors can arise due to faceting in crystalline materials and/or errors in the cross-sectional geometry of the tines (i.e., the tines are not perfectly rectangular). In either case, the drive tines do not oscillate in precisely the same plane, and this creates a torsional couple about the axis of symmetry of the tines. The net effect of this torsional couple is to cause the tines to oscillate in the pickup mode of vibration with a phase which is shifted by 90 degrees relative to the desired rotation signal. The shifted signal is commonly referred to as a quadrature error signal.

The quadrature error signals are often much larger than the desired full scale output of the sensor. It is, therefore, necessary to find a way to reduce these error signals to make practical devices. This is conventionally done by plating masses of material (typically gold) on the ends of the tines and then selectively removing the material from one of the tines with a laser. When mass is removed in this manner, the tines are subjected to a torsional twist about their long axes. If these torsional twists are different in the two tines, a net coupling into the pickup mode oscillation occurs, and this coupled signal can be used to negate the quadrature signals caused by fabrication errors.

The use of a laser for trimming mass in this manner is advantageous in that it is a readily automated and capable of high rates of production. However, it also has a significant disadvantage in that the two tines become unbalanced in mass. This imbalance causes the moments of the tines to be unequal so that a net lateral force is transmitted to the base of the tines and, ultimately, to the fork mount and its surroundings. This coupling of the tuning fork to the surrounding environment degrades the performance of the sensor, particularly if this environment includes any elements with mechanical resonances at or near the drive frequency of the fork.

U.S. Pat. No. 3,683,213 discloses a single ended tuning fork or microresonator which is intended primarily for use as a time standard in wrist watches. In this device, metal film weights are placed on the top surfaces of the tines near their free ends and trimmed to adjust the frequency of the microresonator. In this particular example, the trimming is done only for purposes of frequency adjustment, and has no relevance to quadrature reduction or tine balance.

U.S. Pat. No. 4,379,244 discloses a tuning fork which has electrodes near the stem of the fork for detecting a voltage which is indicative of asymmetrical oscillation of the tines. A laser is used for removing mass from the front surfaces of the tines in order to provide a symmetrical oscillation of the tines and thus a balanced condition. While this technique may result in a balanced fork, it is not useful in tuning fork rate sensors because it does not provide any adjustment of the quadrature output, and the quadrature offset would, in general, remain quite large.

OBJECTS AND SUMMARY OF THE INVENTION

It is in general an object of the invention to provide a new and improved tuning fork and method of manufacture.

Another object of the invention is to provide a tuning fork and method of the above character which overcome the limitations and disadvantages of the prior art.

Another object of the invention is to provide a tuning fork and method of the above character in which quadrature error is reduced without disturbing tine mass symmetry.

These and other objects are achieved in accordance with the invention by providing a tuning fork and method in which a pair of elongated tines having front and rear surfaces are disposed symmetrically about an axis, and balancing masses on the front surface of one tine and on the rear surface of the other tine are trimmed to reduce quadrature error and also to maintain mass balance between the tines.

FIG. 1 is a top plan view of one embodiment of a tuning fork incorporating the invention.

FIG. 2 is an enlarged cross-sectional view taken along line 2—2 in FIG. 1.

FIG. 3 is a view similar to FIG. 2, illustrating the balancing masses after trimming to reduce quadrature error.

As illustrated in FIG. 1, the tuning fork has a pair of drive tines 11, 12 and a pair of pickup tines 13, 14 which extend in opposite directions from a central body or base 16 and are disposed symmetrically about the longitudinal axis 17 of the device. The body includes a frame 18 which surrounds a central opening 19, with a mounting pad 21 within the opening connected to the frame by relatively thin bridges 22. The tuning fork is formed as a unitary structure of a piezoelectric material such as quartz. Drive and pickup electrodes (not shown) are mounted on the tines in a conventional manner.

The free ends of drive tines 11, 12 include areas of increased lateral dimension 23, 24, with balancing masses 26–29 on the upper and lower surfaces of the tines in those areas. The masses are offset laterally of each other, with masses 26, 27 being positioned closer to the inner edges of the tines on the upper surfaces of the enlarged areas and masses 28, 29 being positioned closer to the outer edges of the tines on the lower surfaces. The masses can be formed by any suitable means such as plating gold on the surfaces of the tines.

To reduce quadrature error without producing an imbalance of mass between the tines, substantially equal amounts of mass are removed from opposite surfaces of the two tines. Thus, for example, removing a portion of mass element 26 from the upper surface of tine 11 will produce a reduction in quadrature signal. It will also produce an imbalance in mass between the tines. However, if a similar portion of mass element 29 is removed from the lower side of tine 12, there will be a further reduction in the quadrature signal, but the mass balance of the two tines will be preserved. This situation is illustrated in FIG. 3, with the trimmed mass elements being identified by reference numerals 26a and 29a.

In the event that the removal of the two mass elements does not produce exactly equal reductions in quadrature signal, the combination of the two mass elements being removed will still reduce quadrature error without disturbing tine mass symmetry. This is an important difference between the invention and the prior art.

The determination as to which mass elements to trim is dependent upon the polarity of the quadrature signal. For example, if the quadrature signal is of positive polarity, one might trim mass 26 on the top of tine 11 and mass 29 on the bottom of tine 12. If the polarity is negative, mass 27 would then be trimmed on the top of tine 12, and mass 28 would be trimmed on the bottom of tine 11.

The mass elements can be trimmed by any suitable means such as a laser. In one presently preferred embodiment, the tines are fabricated of a material such as crystalline quartz which is transparent to the laser beam, and all of the masses are trimmed from the same side of the fork. Thus, for example, the laser might be positioned on the front side of the fork, with the beam passing through the fork to trim elements 28, 29 on the back sides of the tines. Alternatively, if desired, the laser beam can be directed to the back sides of the tines by other means such as mirrors, or by turning the tuning fork over.

Instead of depositing masses on the tines and then removing portions of them to reduce quadrature signal, the same result can be obtained by the use of applied masses. In this case, masses are applied to opposite surfaces of the two tines to reduce quadrature error, and although the mass of the tines is increasing rather than decreasing, the symmetry of mass between the two tines is maintained.

In practical devices, it is important to adjust not only the quadrature offset in the mass trimming process, but also the resonant frequencies of both the drive mode oscillation and the pickup mode oscillation. In many instances, the difference in frequency between these two modes is critical and must be tightly controlled. In this case, mass can be removed from the tops of both tines or the bottoms of both tines in a substantially equal amounts to change the resonant frequency without affecting the quadrature offset. With the mass material being removed from the same side of both tines, the resultant twisting in the two tines tends to cancel, and quadrature is neither increased nor decreased.

If mass is removed, the resonant frequency will increase, and if mass is added, the resonant frequency will decrease. By trimming the mass on the drive tines, the frequency of the drive mode will be preferentially affected relative to the frequency of the pickup mode, whereby the difference in frequency between the two modes can be adjusted independently. A similar adjustment of the pickup mode frequency can be made independently of the drive mode by trimming mass from or adding mass to the pickup tines. For this purpose, masses 31, 32 are provided in enlarged areas 33, 34 at the free ends of pickup tines 13, 14.

It is not necessary that the two tines be substantially equal in mass and stiffness prior to adjustment for quadrature offset. If there is an imbalance between the tines, either by design or by errors in fabrication, that imbalance can be corrected by first trimming the mass on one of the tines to eliminate the imbalance, and then trimming equally from both tines for subsequent adjustment. In this way, an inherently asymmetric fork can be corrected as part of the quadrature reduction and frequency adjustment process.

The initial imbalance of a tuning fork can be measured in various ways. One way employs a laser interferometric displacement sensor to monitor vibration of a base on which the fork is mounted. The base is held in such a way that it is free to vibrate in response to any unbalanced moments of the drive tines. The laser is reflected off a target on the base to measure the amplitude and phase of vibration. The balance of the fork is adjusted by removing mass from one of the tines until the vibration is zero, following which quadrature error can be reduced by removing mass from opposite sides of the two tines as described above.

The invention has a number of important features and advantages. It reduces quadrature error without disturbing the symmetry or balance in mass between the tines of a tuning fork, and it also permits the drive mode frequency and the pickup mode frequency to be adjusted independently of each other. It is readily automated for increased productivity and decreased cost.

It is apparent from the foregoing that a new and improved tuning fork and method have been provided. While only certain presently preferred embodiments have been described in detail, as will be apparent to those familiar with the art, certain changes and modifications can be made without departing from the scope of the invention as defined by the following claims.

What is claimed is:

1. In a tuning fork for use in an inertial rate sensor: a pair of elongated tines which have front and rear surfaces and are disposed symmetrically about an axis, and balancing masses on the front surface of one tine and on the rear surface of the other tine trimmed to reduce quadrature error signal in the rate sensor output and also to maintain mass balance between the tines.

2. In a tuning fork for use in an inertial rate sensor: a pair of elongated tines having free ends of enlarged area, a first balancing mass on the front side of the enlarged area of each of the tines, and a second balancing mass on the rear side of the enlarged area of each of the tines, the first and second balancing masses being offset laterally of each other and the tines being fabricated of a material which is transparent to a laser beam employed in trimming the masses on the rear sides of the tines.

3. In a tuning fork for use-in an inertial rate sensor:

a pair of elongated drive tines having front and rear surfaces disposed symmetrically about an axis;

a pair of pickup tines;

balancing masses on the front and rear surfaces of the drive tines which are trimmed to reduce quadrature error signal in the rate sensor output, to maintain mass balance between the drive tines, and to adjust the frequency of the drive mode; and masses on the pickup tines for adjusting the frequency of the pickup mode independently of the frequency of the drive mode.

* * * * *